United States Patent
Takahashi et al.

[11] Patent Number: 6,025,648
[45] Date of Patent: Feb. 15, 2000

[54] SHOCK RESISTANT SEMICONDUCTOR DEVICE AND METHOD FOR PRODUCING SAME

[75] Inventors: Nobuaki Takahashi; Yoshitaka Kyougoku; Katsumasa Hashimoto; Shinichi Miyazaki, all of Tokyo, Japan

[73] Assignee: NEC Corporation, Tokyo, Japan

[21] Appl. No.: 09/061,165

[22] Filed: Apr. 16, 1998

[30] Foreign Application Priority Data

Apr. 17, 1997 [JP] Japan .................................. 9-099502

[51] Int. Cl.[7] .......................... H01L 25/10; H01L 23/02; H01L 23/34
[52] U.S. Cl. ........................ 257/778; 257/777; 257/737; 257/738; 257/783; 257/787; 257/685; 257/686
[58] Field of Search ..................... 257/678, 686, 257/685, 934, 737, 738, 777, 778, 723, 730, 783, 787

[56] References Cited

U.S. PATENT DOCUMENTS

| | | | |
|---|---|---|---|
| 5,001,542 | 3/1991 | Tsukagoshi et al. | 257/783 |
| 5,404,044 | 4/1995 | Booth et al. | 257/723 |
| 5,600,541 | 2/1997 | Bone et al. | 257/686 |
| 5,715,144 | 2/1998 | Ameen et al. | 257/686 |
| 5,727,310 | 3/1998 | Casson et al. | 29/830 |
| 5,786,635 | 7/1998 | Alzoe et al. | 257/778 |
| 5,790,384 | 8/1998 | Ahmad et al. | 257/778 |
| 5,798,567 | 8/1998 | Kelly et al. | 257/780 |
| 5,801,448 | 9/1998 | Ball | 257/778 |
| 5,805,422 | 9/1998 | Otake et al. | 257/778 |
| 5,825,080 | 10/1998 | Imaoka et al. | 257/777 |
| 5,834,848 | 11/1998 | Iwasaki | 257/778 |
| 5,883,426 | 3/1999 | Tokuno et al. | 257/686 |

FOREIGN PATENT DOCUMENTS

| | | |
|---|---|---|
| 2-42739 | 2/1990 | Japan . |
| 3-270030 | 12/1991 | Japan . |
| 3-278511 | 12/1991 | Japan . |
| 4-280667 | 10/1992 | Japan . |
| 6-275775 | 9/1994 | Japan . |
| 7-183426 | 7/1995 | Japan . |
| 8-236694 | 9/1996 | Japan . |

*Primary Examiner*—Alexander Oscar Williams
*Attorney, Agent, or Firm*—Young & Thompson

[57] ABSTRACT

A plurality of substrates 1 to which have been flip-chip mounted semiconductor chips 2 are laminated by means of solder bumps 7 provided for the purpose of lamination. A elastic resin is caused to fill the space between the chip upper surface 9 and the substrate 1, thus providing a shock-absorbing material layer 8. By adopting this type of three-dimensional semiconductor modular structure, the shock-absorbing material layer 8 absorbs externally applied vibration and shock, thereby improving the immunity to vibration and shock.

6 Claims, 2 Drawing Sheets

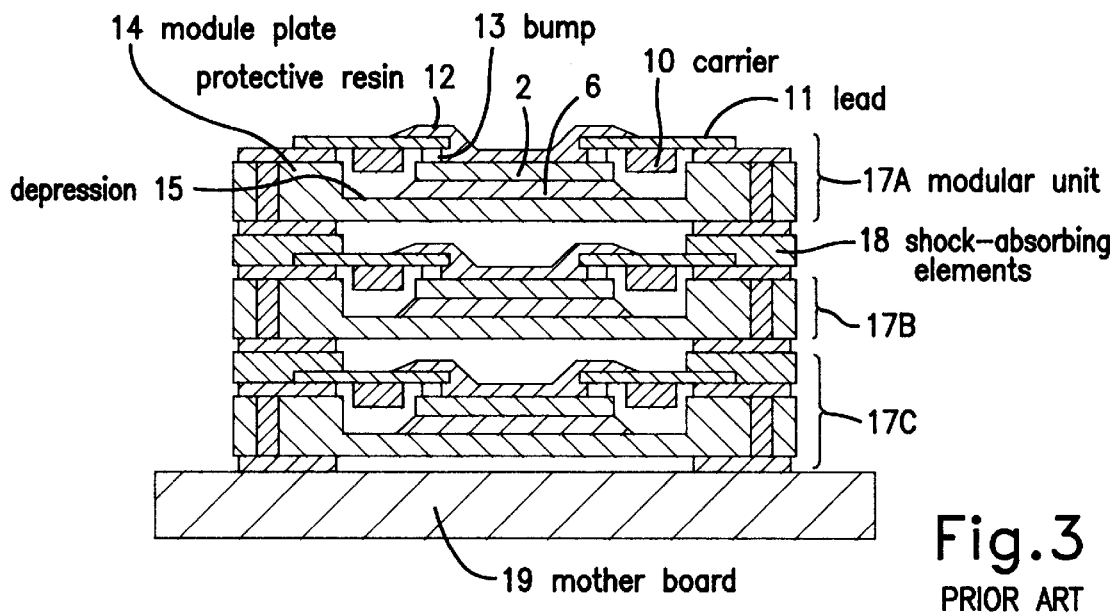
Fig. 3
PRIOR ART
Fig. 4
PRIOR ART
(a)
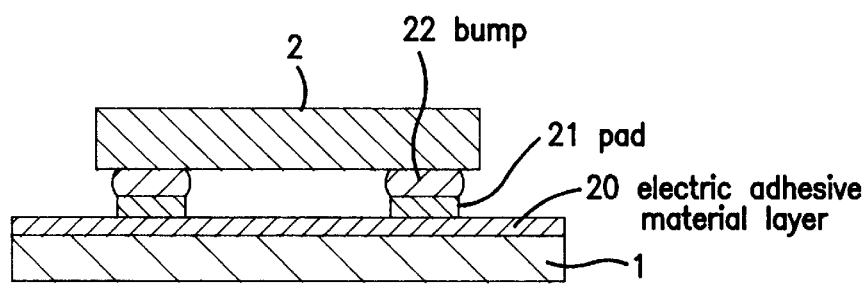
(b)
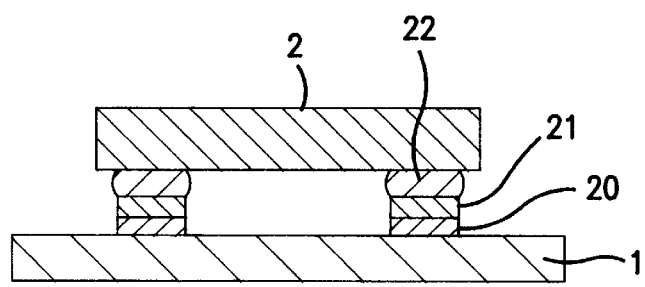

SHOCK RESISTANT SEMICONDUCTOR DEVICE AND METHOD FOR PRODUCING SAME

BACKGROUND OF THE INVENTION

1. Field of the Invention

The present invention relates to a semiconductor device, and more specifically to a semiconductor device having a three-dimensionally laminate structure of a bare chip on a substrate.

2. Description of Related Art

To achieve higher density, compactness, and larger capacity in a semiconductor chip, particularly with regard to packaging of semiconductor memory devices, the method of three-dimensional lamination of chips is widely used. By using this structure, it is possible to achieve a great reduction in mounting surface area.

However, when three-dimensional mounting is done, because of differences in coefficients of thermal expansion, stress and strain caused by thermal history, subsequent failed connections can occur. In applications such as spacecraft, it is necessary to consider immunity to vibration and shock as well, and several related methods have been proposed.

For example, as noted in Japanese Unexamined Patent Publication No.6-275775 and shown in FIG. 3, there is a structure in which a chip 2 is mounted to a TAB (tape automated bonding) tape, to form a TAB device, this having a three-layer laminated structure (17A through 17).

In FIG. 3, the chip 2 is connected to the lead 11 by a bump 13 or by the flip-chip method. The TAB tape side part of the chip 2 is covered by a protective resin 12. The TAB device is mounted on a module plate 14. The module plate 14 is made from a material that has good resistance to heat and that has as good a thermal conductivity as possible.

When mounting the TAB device to the module plate 14, the TAB device is mounted within the depression 15 of the module plate 14, so that the rear surface of the chip 2 makes contact with the inside surface of the depression 15, using an adhesive material 6 that has good thermal conductivity. The outer lead part of the lead 11 of the TAB device is connected to a connection pattern on the outer surface of the module plate 14, thereby forming the module units 17A through 17C, which are made of TAB devices and module plates 14.

A plurality of modular units 17A through 17C are laminated with an intervening shock-absorbing element 18 therebetween. Because the shock-absorbing elements 18 are made of an anistropic electrically conductive resin or an anisotropic electrically conductive rubber and are configured so that there is conduction only in the up/down direction, the laminated modular units are electrically connected. By virtue of the above-noted structure, the shock-absorbing elements 18 absorb externally applied shock and vibration, thereby providing an improvement in the vibration immunity of the device.

Other prior art is disclosed in the Japanese Patent Publication H2-42739. As shown in FIG. 4(a), a elastic adhesive material layer 20 is formed on an insulating substrate 1. Pads 21 and a wiring pattern are formed on top of this elastic adhesive material layer 20. Next, a chip 2 is connected to the top of the pads 21 by means of the bumps 22.

As shown in FIG. 4(b), after forming a elastic adhesive material layer 20 on the top of an insulting substrate 1, parts other than the pads 21 and the wiring pattern are removed by etching. Then, a chip 2 is connected to the top of the remaining pads 21 using the bumps 22.

By adopting a structure such as described above, the elastic adhesive material layer 20 acts as a shock-absorbing layer which intervenes between the chip 2 and the substrate 1, thereby improving the connection reliability therebetween.

In the prior art that was disclosed in the Japanese Unexamined Patent Publication No.6-275775, modular units are laminated and the material used for the purpose of making electrical connections therebetween is an anisotropic electrically conductive resin or an anisotropic electrically conductive rubber. In general, anisotropic electrically conductive resin and anisotropic electrically conductive rubber present the problem of having a large electrical resistance compared with a metal, thereby making actual low-voltage applications, particularly to memory chips, difficult.

In the prior art that is noted in the Japanese Patent Publication H2-42739, solder is used for the connection between the substrate and the chip, and it is realistic to use flux for the purpose of making a reliable connection therebetween. However, if there are residual halogen ions remaining in the flux, it is known that an adverse affect will result on the bare chip.

For this reason, it is desirable to avoid the use of solder in precision equipment such as that used in spacecraft, and to use a material such as gold or the like which does not require flux. In the case of making a flip-chip connection using bumps made of gold, it is necessary to apply force and vibration as well as heat. When this is done, to achieve a reliable connection, it is necessary for the land to have some degree of hardness.

However, in the above-noted prior art, it is difficult to make a connection a bump made of gold or the like with a land on the substrate, because an elastic adhesive material is provided immediately below the land. Additionally, the manufacturing process is complex, and the cost is high.

In view of the above-described drawbacks in the prior art, an object of the present invention is to provide a semiconductor device capable of improving immunity to vibration and shock and having an extremely simple structure.

Accordingly, the object of the present invention is to provide a semiconductor device in which when a plurality of substrate are stacked, the connecting portion can be made with a relatively lower level of resister value and can be driven with a relatively lower voltage level.

SUMMARY OF THE INVENTION

To achieve the above-noted object, the present invention is a semiconductor device having a laminated structure in which a plurality of substrates on one of surfaces of which semiconductor chips are mounted, are laminated and mutually connected electrically to each other, said structure comprising a shock-absorbing material which can absorb shock and vibration disposed between an upper surfaces of said semiconductor chip and another surface of said substrate opposite to said surface thereof.

The present invention includes a method for producing a semiconductor device having laminated structure in which a plurality of substrates on one of surfaces of which semiconductor chips are mounted, are laminated and mutually connected electrically to each other, said method comprising the steps of; a first step of forming a metallic bump on a surface of semiconductor device; a second step of coating a pad portion of said substrate with the metal so as to assemble said semiconductor chip with said substrate; a third step of connecting said semiconductor device to said substrate utilizing a flip-chip method; a fourth step of sealing the connecting portion of said connected portion with sealing resin; a fifth step of disposing solder bump between said substrate each being made in said step 3 and stacking a plurality of said substrates each other; a sixth step of electrically connecting said stacked substrates with each other; and a seventh step of filling a shock-absorbing material which can absorb shock and vibration, between an upper surface of said semiconductor chip and another surface.

According to the present invention, a semiconductor device is of laminated construction is provided which includes a first substrate and a second substrate onto which chips are mounted, the above-noted second substrate being mounted on the above-noted first substrate, and a shock-absorbing material being provided between the front surface of the semiconductor chip on the first substrate and the rear surface of the second substrate.

A feature of the present invention is that the above-noted first and second substrates are mutually connected by means of bumps that are metal electrodes, and that the space between the above-noted laminated substrates is filled with the above-noted shock-absorbing material.

The effect of the present invention is that, by providing a elastic shock-absorbing material between the substrates onto which chips have been laminated and mounted, vibration and shock which are applied externally are absorbed, thereby improving the immunity to vibration and shock.

DESCRIPTION OF THE DRAWINGS

FIG. 3 is a cross-sectional view of a mounting structure of a semiconductor device in the prior art.

FIG. 4 is a cross-sectional view of a mounting structure of a semiconductor device in the prior art.

DETAILED DESCRIPTION OF THE PREFERRED EMBODIMENTS

Embodiments of present invention are described below, with reference being made to the relevant accompanying drawings.

Figure 1:
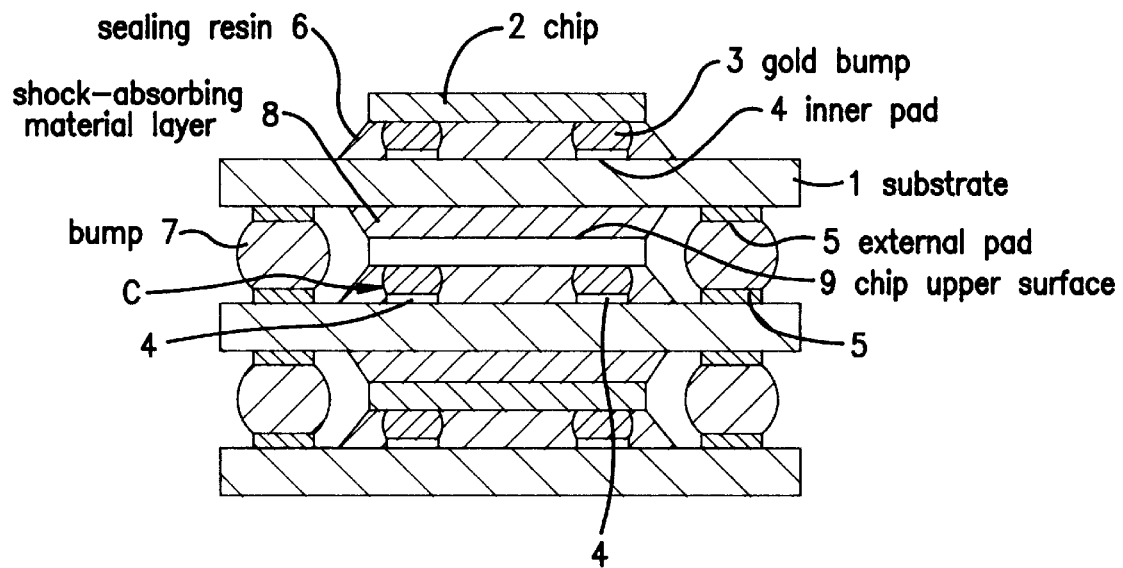
FIG. 1 is a cross-sectional view of the mounting structure of a semiconductor device according to one embodiment of the present invention.

FIG. 1 is a cross-sectional view of the mounting structure of a semiconductor device according to one embodiment of the present invention. The method of fabrication thereof will be described below, with reference being made to FIG. 1. A substrate 1 made of, for example alumina or ceramic or the like, onto which internal pads 4 and a wiring pattern are formed and a chip 2 on which the gold bumps 3 are formed are flip-chip connected. The gold bumps 3 are fabricated by the ball method, for example, using gold wire.

On the internal pads 4 of on the substrate side 31, to assure a reliable connection by the gold bumps 3, gold is formed to a thickness of 1 to 5 μm beforehand, using either plating or sputtering. When the flip-chip connection is made, the application of heat and pressure or vibration are both used to effect a hot-press bond. Then, a sealing resin 6 is injected between the chip 2 and the substrate 1, and the connected portion C of gold bump 3 is covered with resin 6, and this resin 6 is cured to make a seal.

Then, a shock-absorbing material layer 8 which has elasticity is provided on the chip surface 9, and semi-cured. A shock-absorbing material for the present invention is made from silicone resin or epoxy resin or the like which has elasticity. On the external pads 5 on the substrate 1 on which the chip 2 is mounted, bumps 7 for lamination are formed. The lamination bumps 7 are formed, for example, by placing lead-tin solder balls on the external pads 5 using the viscosity of flux or the like, and heating so as to fuse them. The height of the thus-formed bumps 7 is made at least higher than the height from the surface of the substrate 1 to the surface of the shock-absorbing material layer 8, by selecting the solder ball size.

Next, a plurality of substrates 1 onto which the chip 2 is mounted are laminated, reflow is used to melt the solder to make all connections at one time. Simultaneously with this, the shock-absorbing material layer 8 is completely cured, thereby forming the mounting structure for the semiconductor that is shown in FIG. 1. Resin can also be injected after the lamination process to form the shock-absorbing material layer 8.

By adopting the above-described semiconductor mounting structure, because there is a elastic shock-absorbing material layer 8 made of resin between the chip upper surface 9 and the substrate 1, externally applied vibration and shock are absorbed, thereby improving the immunity to vibration and shock. Additionally, because connections between substrates 1 are made by means of metal (solder) bumps 7, the electrical resistance is low. Additionally, because there is no elastic layer under the internal pads 4 of the substrate, it is possible to made good connection between the chip 2 and the substrate 1 by means of bumps made of gold or the like.

Although the example described is that of using gold bumps to connect the chip 2 to the substrate 1, it is also possible to use solder bumps or the like.

Figure 2:
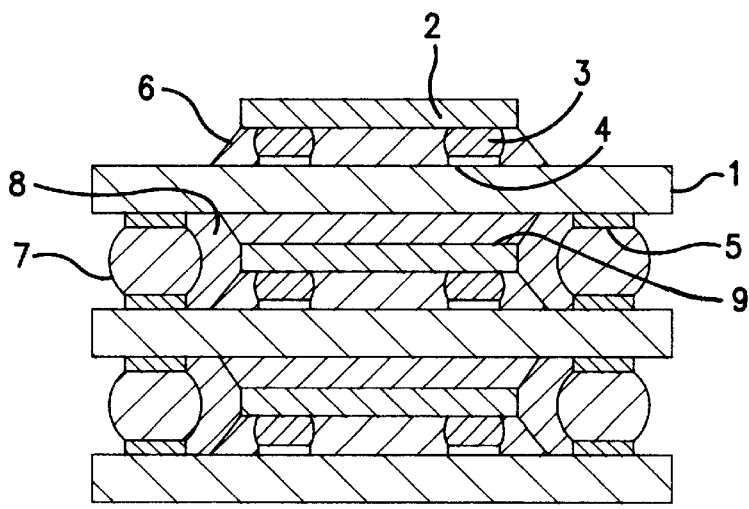
FIG. 2 is a cross-sectional view of the mounting structure of a semiconductor device according to another embodiment of the present invention.

FIG. 2 is a cross-sectional view of the mounting structure of a semiconductor device according to another embodiment of the present invention. A substrate 1 on which are formed internal pads 4 and a wiring pattern and a chip 2 are flip-chip connected. On the internal pads of the substrate 1, to assure a reliable connection by gold bumps 3, gold layer is formed to a thickness of 1 to 5 μm beforehand, using either plating or sputtering. When the flip-chip connection is made, the application of heat and pressure or vibration are both used to effect a hot-press bond.

Then a resin 6 for sealing is injected between the chip 2 and the substrate 1, and caused to be cured. Then on the external pads 5 on the substrate on which the chip 2 is mounted, bumps 7 for lamination are formed. The lamination bumps 7 are formed from, for example, lead-tin solder. Next, a plurality of substrates 1 onto which chips 2 have been mounted is laminated, and reflow is used to melt to solder to make all connections at one time. Next, a elastic resin is injected to fill the space between each substrate 1, this is caused to be cured, so as to form the shock-absorbing material layer 8, thereby obtaining the semiconductor mounting structure that is shown in FIG. 2.

In the case in which it is not possible to sufficiently inject resin in the space between the bottom surface of the substrate 1 and the top surface 9 of the chip because this space is too narrow, after forming the substrates 1 having the chip 2 in the same manner as the first embodiment, a elastic resin is injected in the space between the substrates 1, this being used as the shock-absorbing material layer 8, thereby obtaining the semiconductor mounting structure that is shown in FIG. 2.

By adopting the above-noted semiconductor mounting structure, because there is a elastic shock-absorbing material layer 8 between each of the laminated substrates, externally applied vibration and shock are absorbed, thereby improving the immunity to vibration and shock. Additionally, because connections between substrates 1 are made by means of metal (solder), the electrical resistance is low. Additionally, because there is no elastic layer under the internal pads 4 of the substrate, it is possible to made good connection between the chip 2 and the substrate 1 by means of bumps made of gold or the like.

Although the example described is that of using gold bumps to connect the chip 2 to the substrate 1, it is also possible to use solder bumps or the like.

According to the present invention as is described above, because a elastic shock-absorbing material is provided between substrates already having chips mounted to them which are laminated and connected, externally applied vibration and shock are absorbed, immunity to vibration and shock is improved. By doing this, it becomes possible to use three-dimensionally laminated modules in applications such as spacecraft and vehicles, which are subject to vibration and shock.

What is claimed is:

1. A shock and vibration resistant semiconductor device assembly comprising:

a first rigid substrate supporting and electrically connected via a first set of metallic bumps to a first semiconductor chip;

a second rigid substrate supporting and electrically connected via a second set of metallic bumps to a second semiconductor chip;

a shock absorbing material intermediate an upper surface of said first semiconductor chip and a lower surface of said second rigid substrate, said shock absorbing material contacting both said upper surface of said first semiconductor chip and said lower surface of said second rigid substrate;

a third set of metallic bumps arranged intermediate and contacting said first and said second rigid substrate, wherein a perimeter of said first rigid substrate is in registration with a perimeter of said second rigid substrate.

2. The device assembly of claim 1, further comprising sealing resin from an upper surface of said first rigid substrate extending to a lower surface of said first semiconductor chip, wherein said resin terminates approximately at said lower surface of said first semiconductor chip.

3. The device assembly of claim 2, wherein said shock absorbing material extends to said upper surface of said first rigid substrate.

4. The device assembly of claim 3, wherein said shock absorbing material extends to and contacts said third set of metallic bumps.

5. The device of claim 4, wherein said first set of metallic bumps comprises gold bumps.

6. The device of claim 4, wherein said third set of metallic bumps comprises solder bumps.

* * * * *